(12) United States Patent
Pimpinella et al.

(10) Patent No.: US 12,372,714 B2
(45) Date of Patent: *Jul. 29, 2025

(54) OPTICAL CHANNEL BANDWIDTH ANALYZER

(71) Applicant: Panduit Corp., Tinley Park, IL (US)

(72) Inventors: Richard J. Pimpinella, Prairieville, LA (US); Jose M. Castro, Naperville, IL (US); Asher S. Novick, New York, NY (US); Yu Huang, Orland Park, IL (US); Bulent Kose, Burr Ridge, IL (US)

(73) Assignee: Panduit Corp., Tinley Park, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/369,947

(22) Filed: Sep. 19, 2023

(65) Prior Publication Data

US 2024/0004128 A1   Jan. 4, 2024

Related U.S. Application Data

(63) Continuation of application No. 17/942,430, filed on Sep. 12, 2022, now Pat. No. 11,768,327, which is a
(Continued)

(51) Int. Cl.
*G02B 6/028* (2006.01)
*G01S 7/481* (2006.01)
(Continued)

(52) U.S. Cl.
CPC .......... *G02B 6/0288* (2013.01); *G01S 7/4818* (2013.01); *G01S 7/4917* (2013.01);
(Continued)

(58) Field of Classification Search
CPC .......... G01M 11/3109; G02B 6/0288
See application file for complete search history.

(56) References Cited

U.S. PATENT DOCUMENTS 6,400,450 B1   6/2002  Golowich et al.
6,924,890 B1   8/2005  Vobian et al.
(Continued)

FOREIGN PATENT DOCUMENTS

CN      105577299 A        5/2016
JP      2014500975 A   *   1/2014
(Continued)

OTHER PUBLICATIONS

JP-2014500975-A English translation (Year: 2014).*
KR-20130139998-A English translation (Year: 2013).*

*Primary Examiner* — Charlie Y Peng
(74) *Attorney, Agent, or Firm* — Christopher K. Marlow; Christopher S. Clancy; James H. Williams

(57) ABSTRACT

A test apparatus has at least one optical source, a high-speed photodetector, a microcontroller or processor, and electrical circuitry to power and drive the optical source, high-speed photodetector, and microcontroller or processor. The apparatus measures the frequency response and optical path length of a multimode optical fiber under test, utilizes a reference VCSEL spatial spectral launch condition and modal-chromatic dispersion interaction data to estimate the channels total modal-chromatic bandwidth of the fiber under test, and computes and presents the estimated maximum data rate the fiber under test can support.

7 Claims, 17 Drawing Sheets

Related U.S. Application Data continuation of application No. 16/693,980, filed on Nov. 25, 2019, now Pat. No. 11,442,224.

(60) Provisional application No. 62/774,407, filed on Dec. 3, 2018.

(51) Int. Cl.
*G01S 7/4912* (2020.01)
*H01S 5/183* (2006.01)
*H04B 10/69* (2013.01)
*G02B 6/12* (2006.01)

(52) U.S. Cl.
CPC ........... *H01S 5/183* (2013.01); *H04B 10/691* (2013.01); *G02B 2006/12121* (2013.01)

(56) References Cited

U.S. PATENT DOCUMENTS

| | | | |
|---|---|---|---|
| 7,945,159 B2 | 5/2011 | Pape | |
| 9,377,377 B2 | 6/2016 | Chen et al. | |
| 9,377,579 B2 | 6/2016 | Molin et al. | |
| 2015/0338578 A1* | 11/2015 | Bickham | G02B 6/26 29/592.1 |
| 2017/0205311 A1 | 7/2017 | Achten et al. | |
| 2017/0331549 A1* | 11/2017 | Molin | H04B 10/0795 |
| 2020/0017418 A1 | 6/2020 | Pimpinella et al. | |

FOREIGN PATENT DOCUMENTS

| | | | |
|---|---|---|---|
| KR | 20130139998 A | * | 12/2013 |
| TW | M481403 U | | 7/2014 |

* cited by examiner

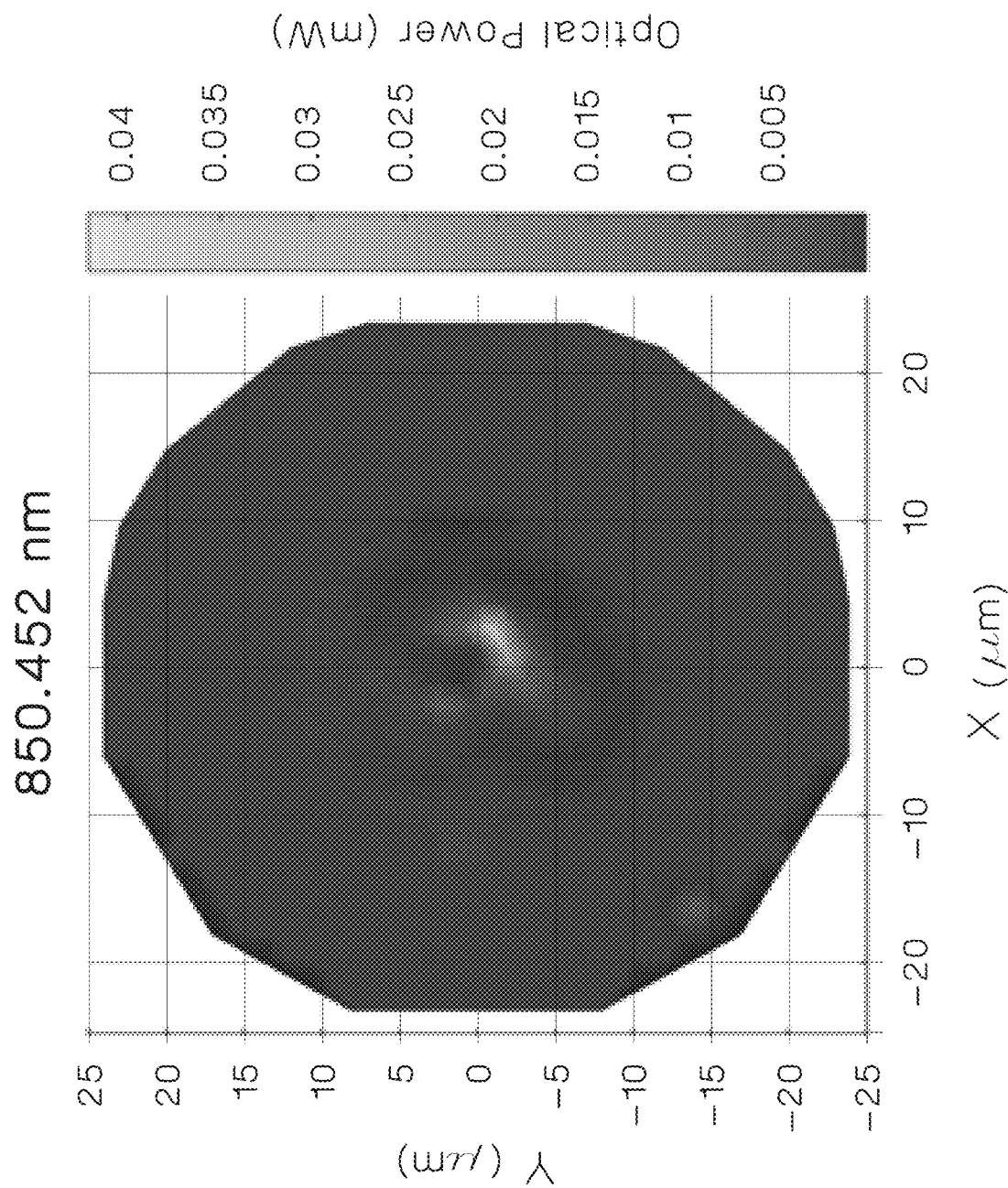

OPTICAL CHANNEL BANDWIDTH ANALYZER

CROSS REFERENCE TO RELATED APPLICATION

This application is a continuation of U.S. patent application Ser. No. 17/942,430, filed Sep. 12, 2022, which is a continuation of U.S. patent application Ser. No. 16/693,980, filed Nov. 25, 2019, which issued as U.S. Pat. No. 11,442,224 on Sep. 13, 2022, and claims priority to U.S. Provisional Application No. 62/774,407, filed Dec. 3, 2018, the subject matter of which is hereby incorporated by reference in its entirety.

FIELD OF THE INVENTION

The following application is related generally to analyzing multi-mode optical fibers and more specifically to analyzing multi-mode optical fibers to determine the maximum bandwidth capacity.

BACKGROUND

Traditionally, the primary optical power penalties limiting the maximum reach of multimode fiber (MMF) optical channels was connector insertion loss and fiber attenuation. However, as communication data rates increase beyond 10 Gb/s, the primary optical penalty is signal broadening (eye closure) due to modal and chromatic dispersions in the optical media. Due to dispersion effects, the maximum channel reaches for higher-speed communications have been decreasing from 400 m over OM4 fiber for 10 Gb/s (10 GBASE-SR), to 150 m for 40 Gb/s (40 GBASE-SR4), 100 m for 100 Gb/s (100 GBASE-SR4), and 85 m for 128 Gb/s Fibre Channel. For these higher-speed systems, insertion loss and fiber attenuation have little if any effect on limiting maximum channel reach.

Optical Multimode Fiber Types OM3, OM4, and OM5, are characterized by minimum effective modal bandwidth (EMB), ranging from 2000 MHz·km for OM3, to 4700 MHz·km for OM4 and OM5 at the nominal operating wavelength of 850 nm. However, due to an interaction between modal and chromatic dispersions in channels utilizing vertical cavity surface emitting laser (VCSEL) based transceivers, the actual total operating channel bandwidth is unknown. It is therefore increasingly important to have the capability of measuring MMF bandwidth in the field in order to ensure the channels can support the required data rates over the required reaches of the installed structured cabling. Unfortunately, due to the very high cost of high-speed commercial test equipment, bandwidth measurements in the field are not practical and are cost prohibitive.

In this disclosure, we describe a new method and low-cost apparatus for measuring the channel bandwidth distance product of VCSEL transmission over the MMF optical cabling infrastructure under test in order to determine the maximum data rate the optical cabling infrastructure can support, taking into account the interactions between modal and chromatic dispersions. The apparatus and method according to the present invention estimates the channel bandwidth and measures the optical length of the fiber under test utilizing a VCSEL transceiver and optical time-domain reflectometry. Utilizing reference data, one result of the measured data analysis is the display of the estimated maximum data rate the fiber cabling under test can support. An apparatus and method according to the present invention can let the user know if a legacy cabling infrastructure can be re-used for future upgraded higher data rate.

Since the standardization of 10 Gb/s Ethernet (10 GBASE-SR) and laser-optimized OM3 multimode fiber (MMF) in 2002, the deployment of MMF has been rapidly growing and is now commonplace in most data communication networks. However, with the relentless demand for increases in Ethernet data rates and the need for longer reaches, new MMF types including OM4, and OM5 have been introduced into the marketplace. In general, the difference between these MMF types is their minimum Effective Modal Bandwidth (EMB), and the wavelength dependence of the EMB. EMB is a parameter that characterizes the MMF's ability to minimize the distortion of the transmitted optical signal as it propagates through the fiber. The higher the EMB, the lower the optical signal distortion.

Due to process variations in the fiber manufacturing process, there is a relatively large distribution of EMB values. Following the fabrication process, based on the fiber's EMB, fibers are sorted as OM3 and OM4, where OM3 has an EMB of at least 2000 MHz km and OM4 has an EMB of at least 4700 MHz km at the measurement wavelength of 850 nm. However, EMB alone is not sufficient to predict the performance of an optical channel. It has been shown that in addition to chromatic dispersion due to spectral width, the spatial-spectral emission pattern of the light emitted by a VCSEL transmitter also plays a critical role in the modal bandwidth of the MMF channel.

During the development of 10 Gb/s Ethernet and OM3 fiber, it was assumed that VCSELs launch the same optical spectrum into all the different fiber modes uniformly. However, in 2008 Panduit fiber researchers discovered that this is not the case. Shorter wavelengths are emitted at large radial offsets and with larger angles normal to the surface of the VCSEL and consequently, couple into higher-order fiber modes in the outer regions of the fiber core. In FIGS. 1$a$-1$d$, we show the spatial spectral emission pattern for four of the wavelength modes coupled into a MMF by a nominal VCSEL transceiver. We see that the longest wavelength (850.452 nm) is emitted from the central region of the VCSEL, which tends to couple into low-order modes close to the fiber optic axis. The shortest wavelength 849.108 nm on the other hand, couples into an annular region having larger radial offsets. In FIGS. 2$a$-2$c$, we plot the center wavelength as a function of radial offset across a MMF core for three VCSEL transceivers. We see that the center wavelength of the coupled power varies from longer wavelength at the center of the fiber, to a shorter wavelength near the core-cladding interface, which excites the highest order fiber modes at large radial offsets. As a consequence of this spectral-spatial emission bias, different fiber modes contain different wavelengths, and therefore, in addition to modal dispersion, radial fiber modes also undergo a chromatic dispersion relative to each other due to their differences in wavelength.

As a consequence of process variation in the production of MMF, depending on the bias 301 or 302 in refractive index profile 300 in FIG. 3, when the fiber is coupled to a VCSEL the modal dispersion of the optical communication system will change due to a shift in modal dispersion resulting from their variation in wavelengths and chromatic dispersion. In other words, due to the chromatic dispersion in glass and the fact that different mode groups have different wavelengths, the mode groups will propagate at different speeds as a result of both modal and chromatic dispersion resulting in a total combined fiber-VCSEL channel bandwidth, which is highly dependent on the production variations in refractive index profile.

In FIG. 4, we show the bit error rate (BER) performance for two MMFs 401 and 402 with identical EMB values of about 2400 MHz·km, using the same VCSEL transceiver. Based on the measured EMB, one would predict the BER performance for these two fibers would be essentially identical. However, fiber 401 has a refractive index profile resembling variation 301 in FIG. 3, and fiber 402, has an index profile resembling variation 302. Due to the opposite bias of index profile variation and the interaction of modal and chromatic dispersions, the BER channel performance when coupled to the same 10 Gb/s Ethernet compliant transceiver results in a difference in bit error rate of more than 3-orders of magnitude at a receive power of −10 dBm. It has been shown that for bias 301 and 302 in refractive index profile 300 have peak optimized EMBs shifted away from the nominal 850 nm, where bias 301 results in a peak EMB shifted to a longer wavelength, e.g., 870 nm, whereas bias 302, results in a fiber with its peak EMB shifted to a shorter wavelength i.e., less than 850 nm. Therefore, in addition to the variation in optical penalty caused by the modal-chromatic interaction, the bias in refractive index profile shown in FIG. 3, also shifts the EMB wavelength dependence in the optical channel. In FIG. 5, we show the calculated channel reaches 501 and 502 using the measured wavelength dependent EMBs for the same two fibers 401 and 402.

Hence, due to the bias in MMF refractive index profile, the spatial-spectral coupling of VCSEL modes into fiber modes, and the operating transceiver wavelength, it is generally unknown what the maximum data rate or channel reach the fiber-transceiver communication system will ultimately be. Therefore, there is a need for a portable apparatus that can measure the bandwidth of a multimode optical fiber and estimate the maximum data rate and/or maximum reach a fiber-VCSEL based system can support.

SUMMARY

A test apparatus has at least one optical source, a high-speed photodetector, a microcontroller or processor, and electrical circuitry to power and drive the optical source, high-speed photodetector, and microcontroller or processor. The apparatus measures the frequency response and optical path length of a multimode optical fiber under test, utilizes a reference VCSEL spatial spectral launch condition and modal-chromatic dispersion interaction data to estimate the channels total modal-chromatic bandwidth of the fiber under test, and computes and presents the estimated maximum data rate the fiber under test can support.

BRIEF DESCRIPTION OF THE FIGURES

FIGS. 1a-1d depict near field images of the optical power distribution at the output end of a laser optimized MMF patch cord showing spatial distribution of four discrete wavelength modes emitted from a single VCSEL transceiver.

DETAILED DESCRIPTION OF THE INVENTION

FIGS. 1a-1d depict near field images of the optical power distribution at the output end of a laser optimized MMF patch cord showing spatial distribution of four discrete wavelength modes emitted from a single VCSEL transceiver. The distribution in power intensity is illustrated by the color scale shown on the right of each image, where yellow represents high optical power and blue represents low optical power. It can be seen that the longest wavelength (850.452 nm) is confined to the inner region of the MMF and therefore, the power for this wavelength is carried by low-order fiber modes propagating in the central region of the fiber. The optical power for the shortest propagating wavelength (849.108) is seen to occupy an annular region within the fiber core ranging over a radial offset of about 8-15 microns. This data illustrates the spatial dependence of the spectral components of the propaging optical signal.

Figure 1B:
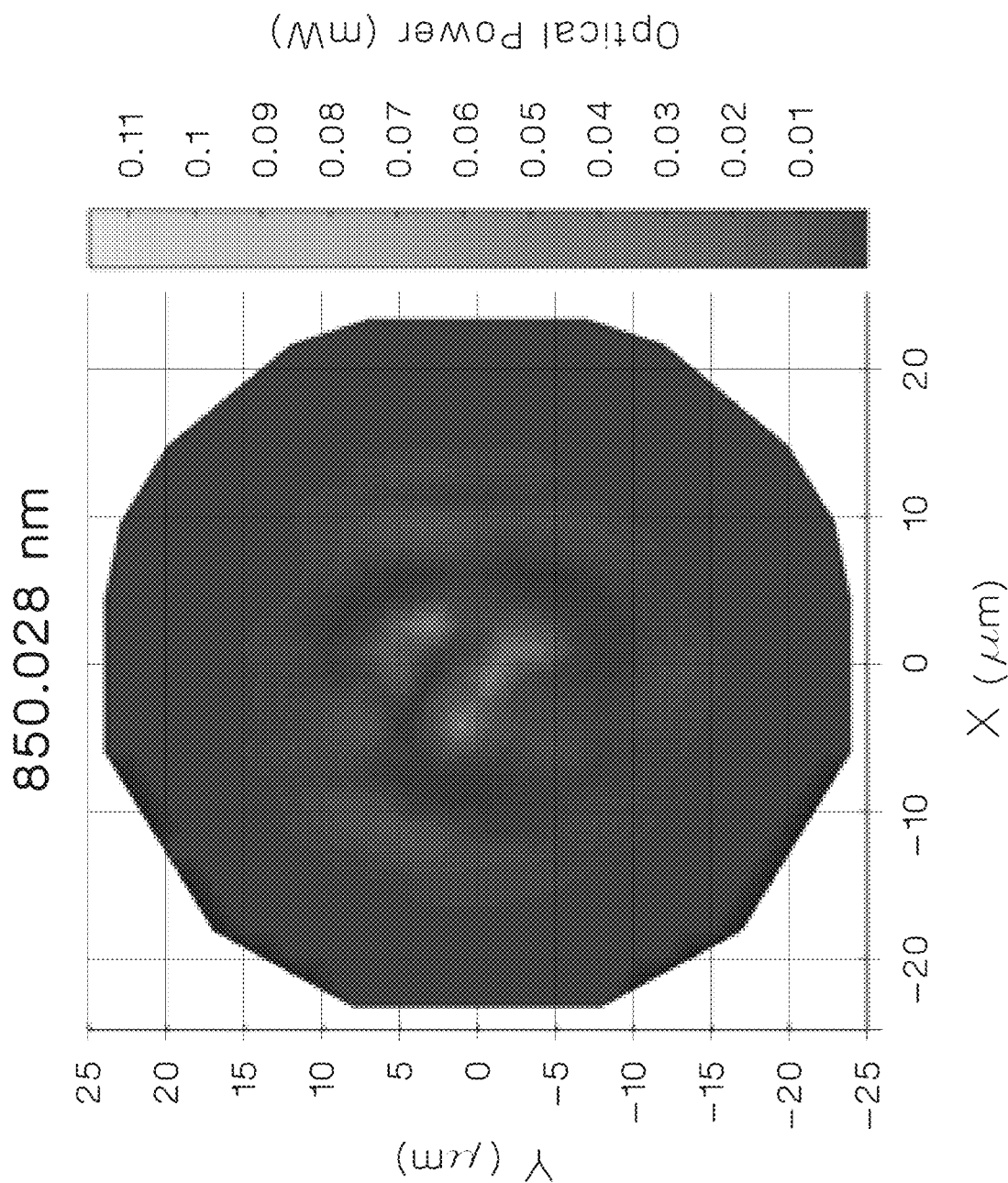
Figure 1C:
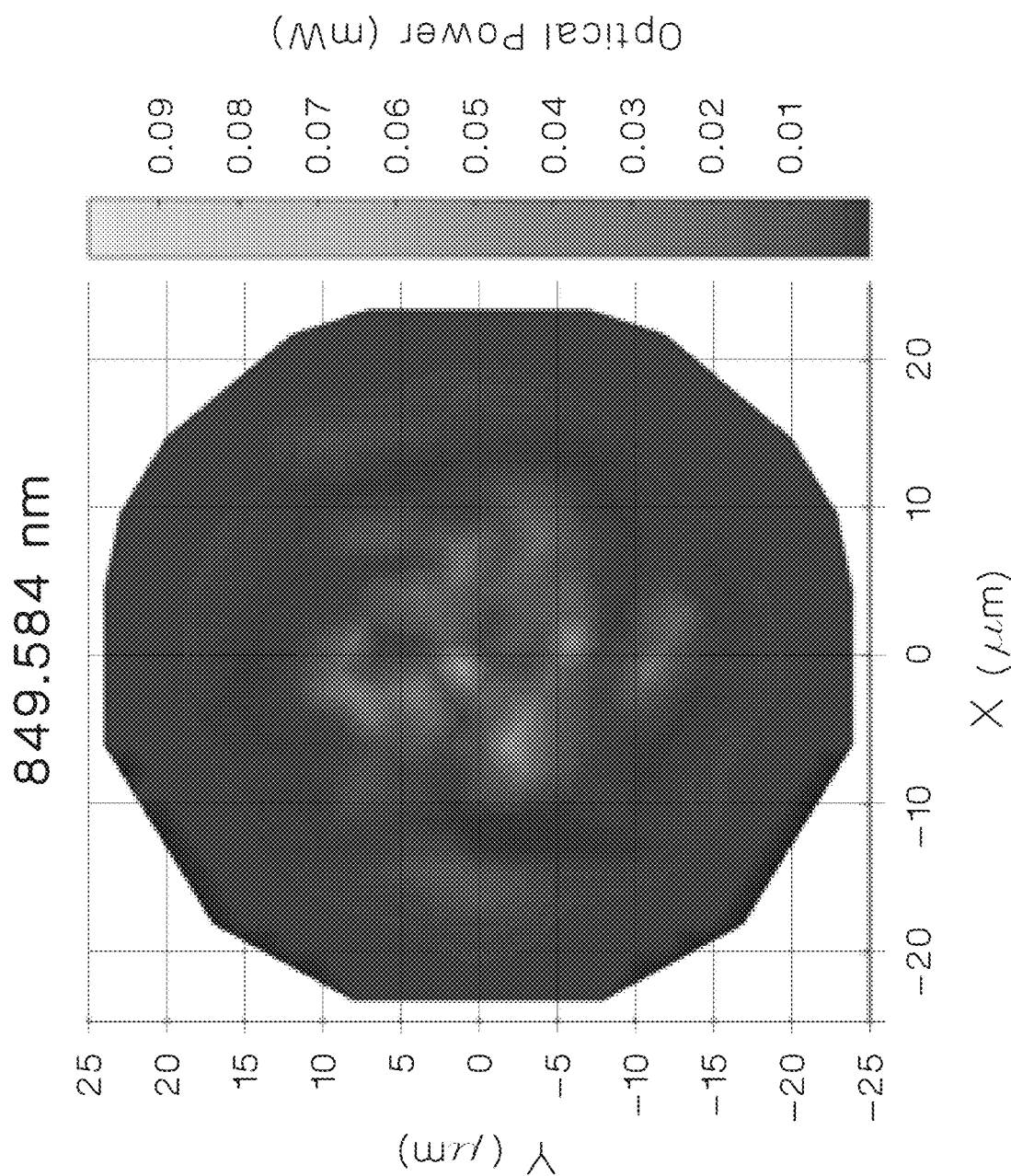
Figure 1D:
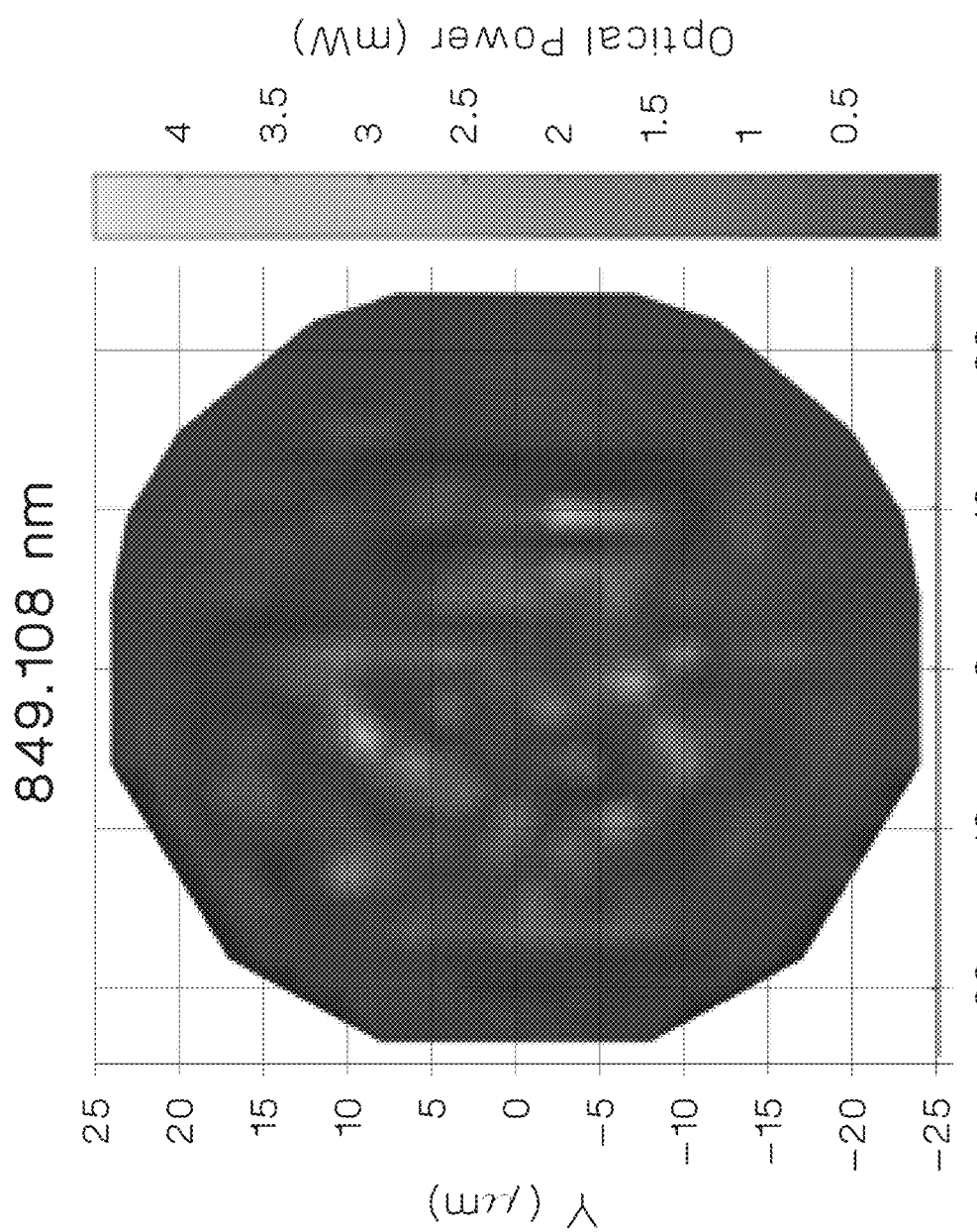
Figure 2A:
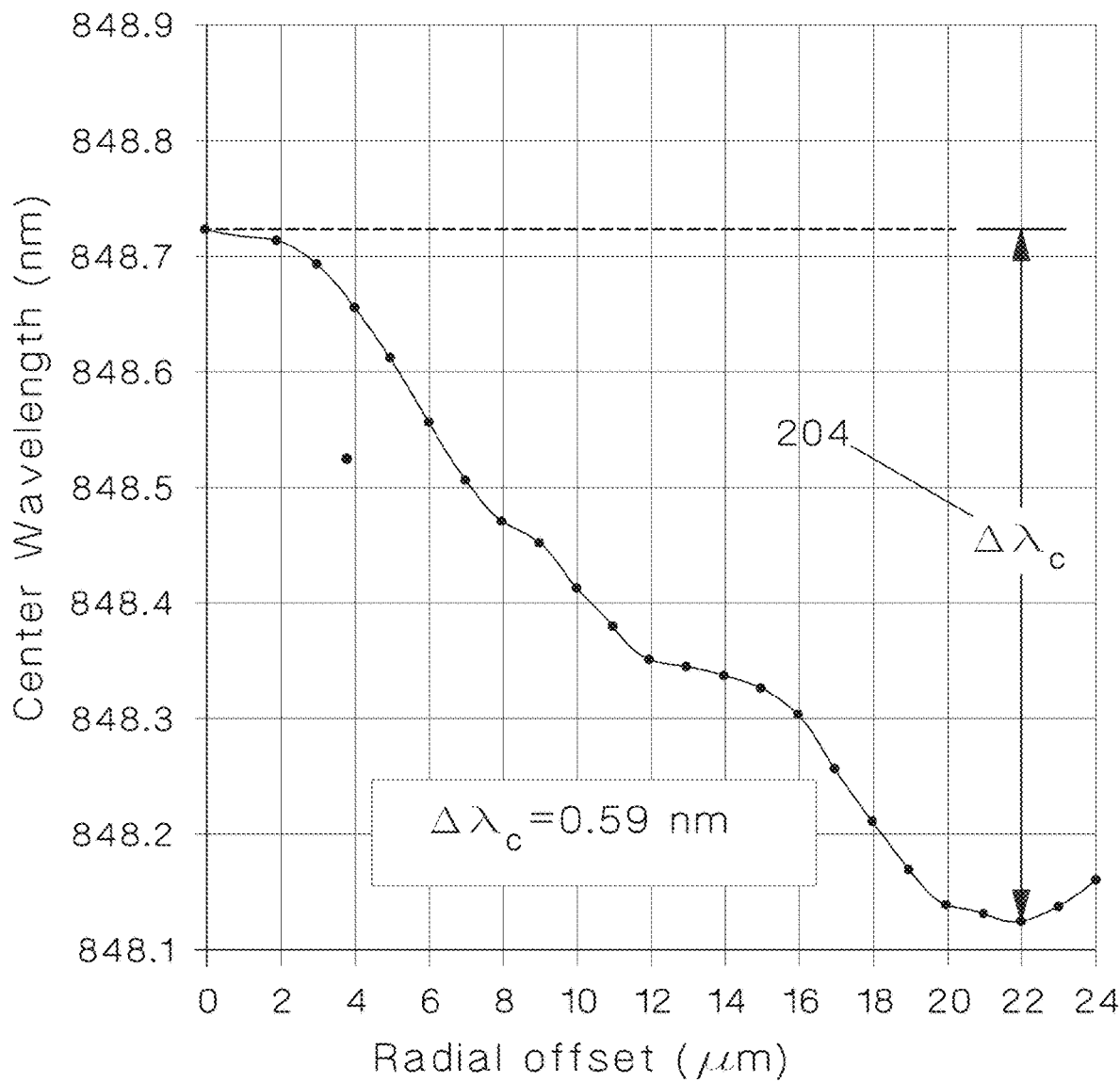
FIGS. 2a-2c depict three plots of the measured root mean square (RMS) central wavelength as a function of radial offset of the optical power coupled into a MMF for three representative 10 Gb/s 802.3ae Standards compliant VCSEL transceivers.
Figure 2B:
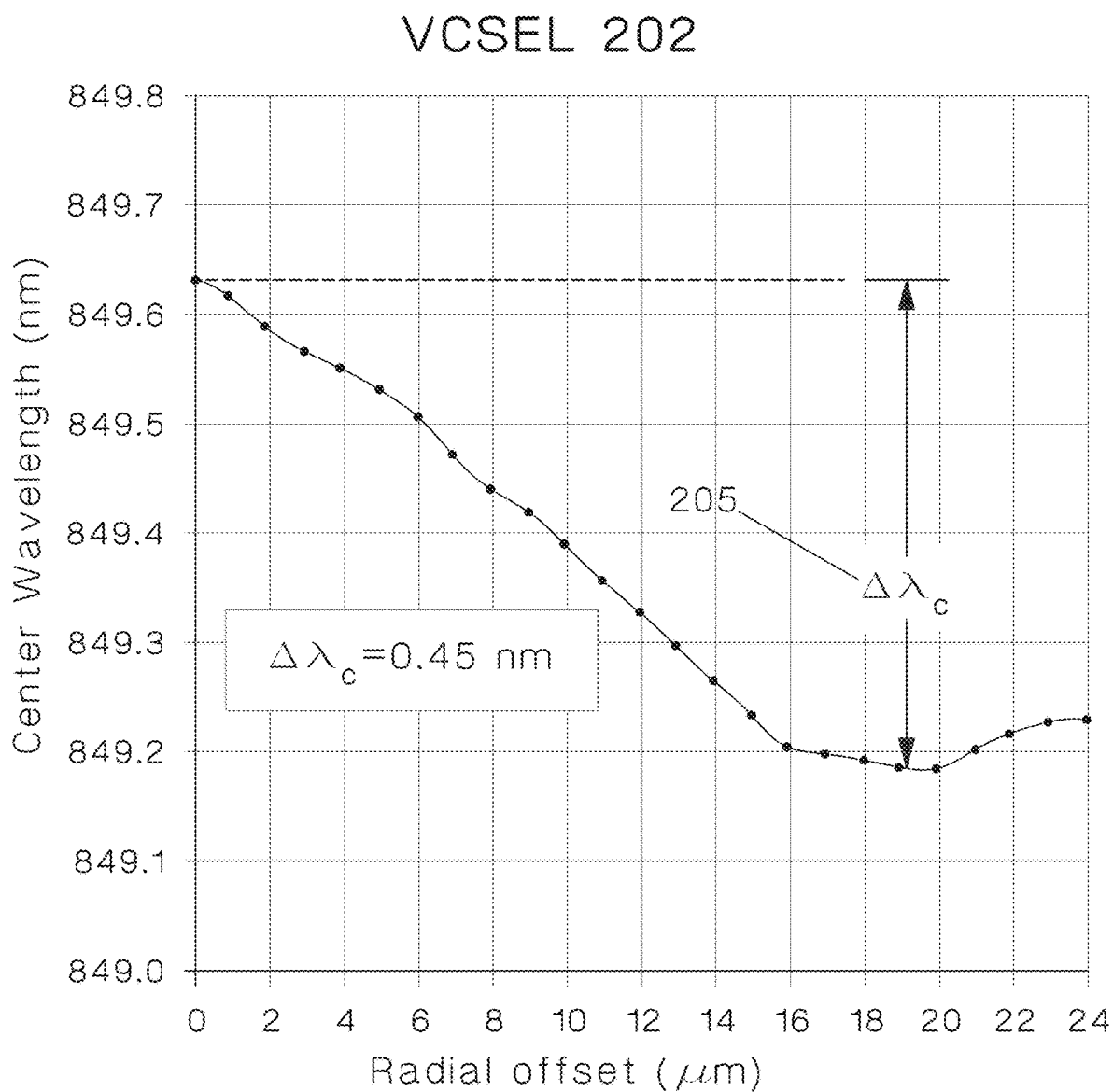
Figure 2C:
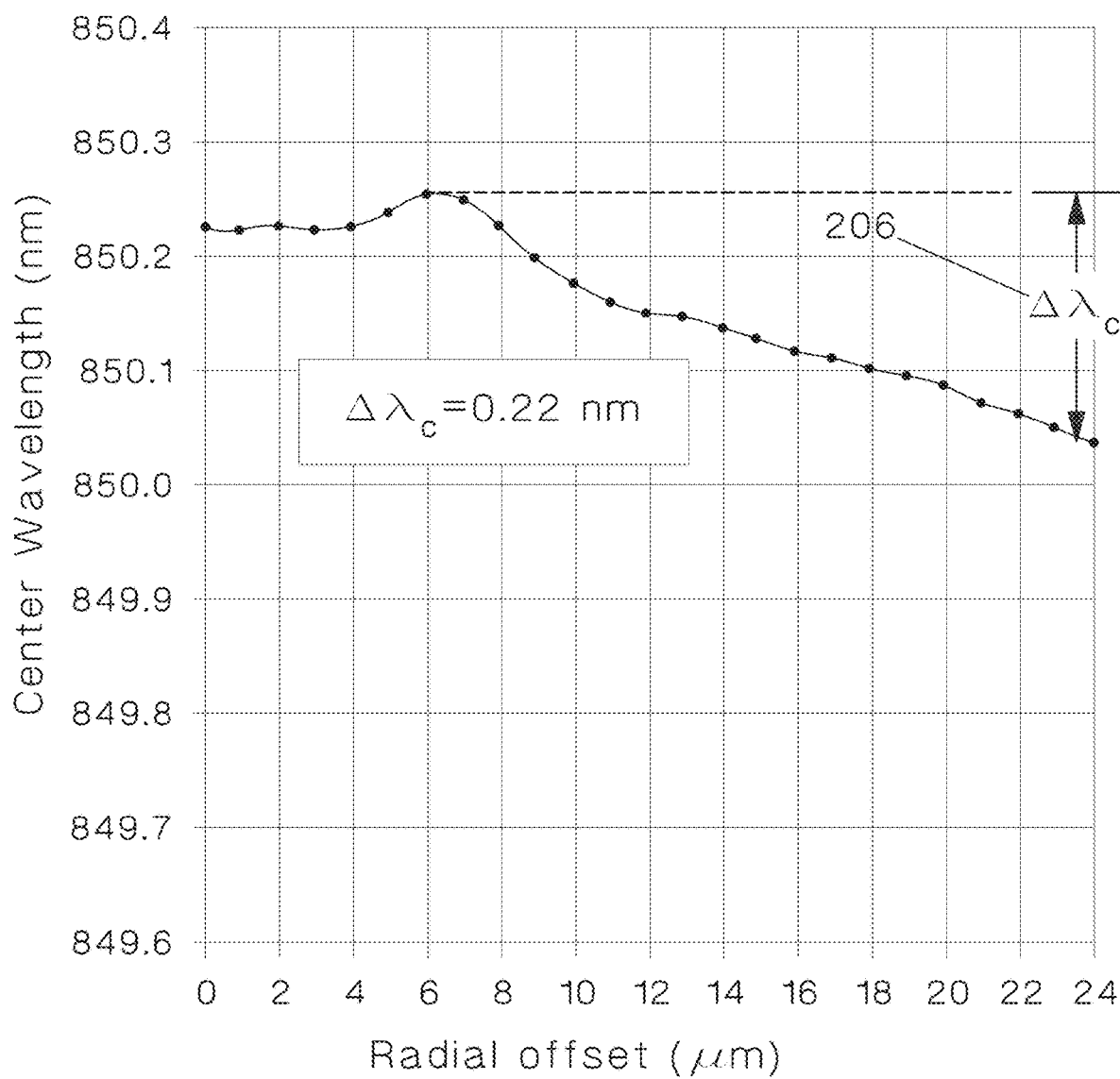

FIGS. 2a-2c depict three plots of the measured root mean square (RMS) central wavelength as a function of radial offset of the optical power coupled into a MMF for three representative 10 Gb/s 802.3ae Standards compliant VCSEL transceivers 201, 202, and 203. VCSEL 201 represents an optical launch condition where the radial distribution in central wavelength in the MMF is large, whereas VCSEL 203 produces the smallest variation of the three. We can quantify this radial variation in central wavelength as the difference in central wavelength between any two radial offsets. For illustration, here we defined the difference in central wavelength, $\Delta\lambda_c$, between the radial offsets showing the maximum variation in central wavelength.

Figure 3:
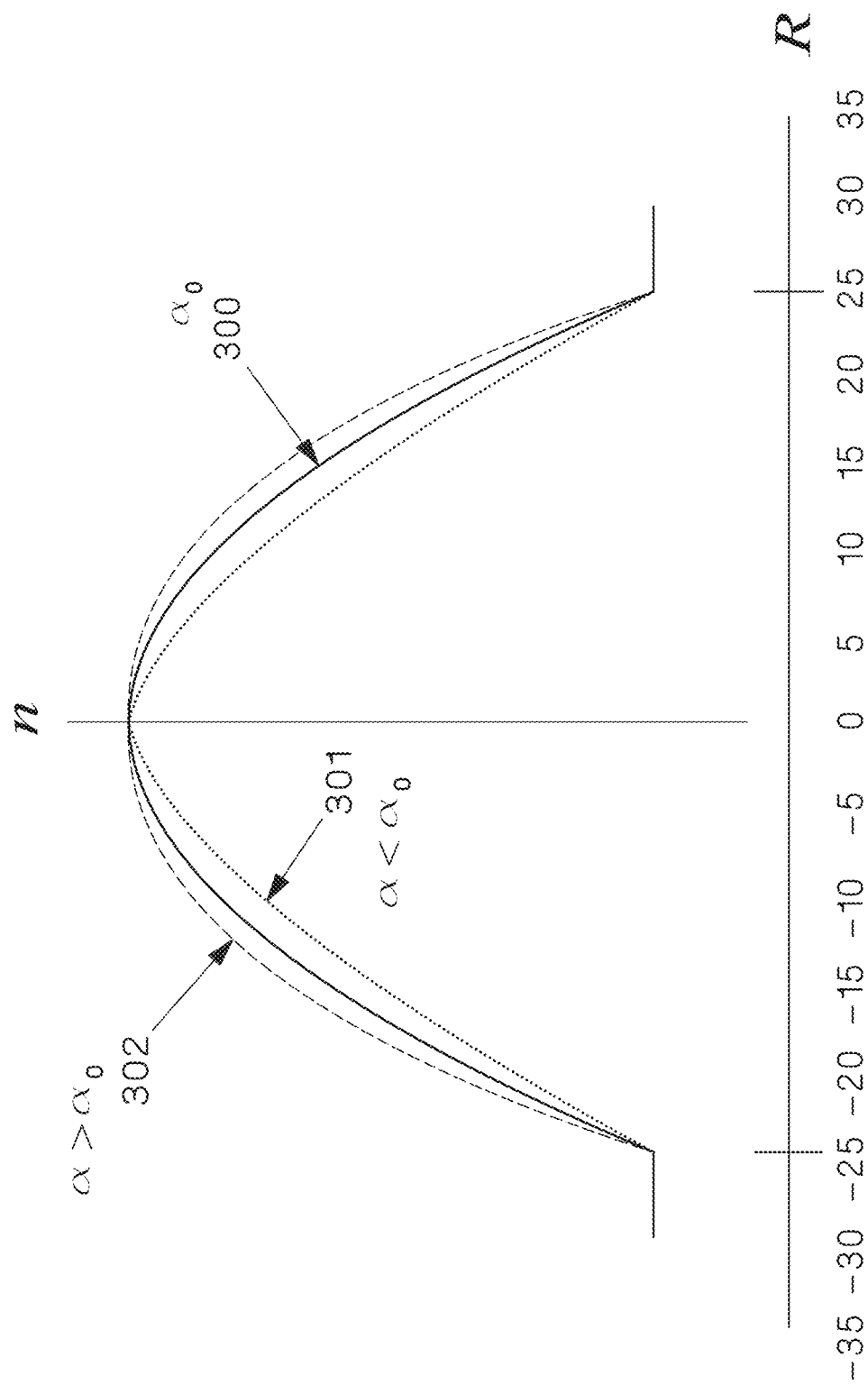
FIG. 3 depicts an illustration of the variation in a refractive index profiles of a multimode fiber.

FIG. 3 depicts an illustration of the variation in a refractive index profiles of a multimode fiber. The black solid curve 300 represents the manufacturing targeted profile for an optimized wavelength of 850 nm. The curve labelled 301 represents a variation from the targeted 850 nm index profile where the result of this profile is a fiber having an optimized EMB at a wavelength longer than 850 nm. The curve labeled 302 represents a variation in the alpha parameter where the fiber is optimized for a shorter wavelength. As a consequence of the refractive index bias, two fibers exhibiting bias 301 and 302 can the same measured EMB, but the opposite bias results in difference in total modal and chromatic dispersions.

Figure 4:
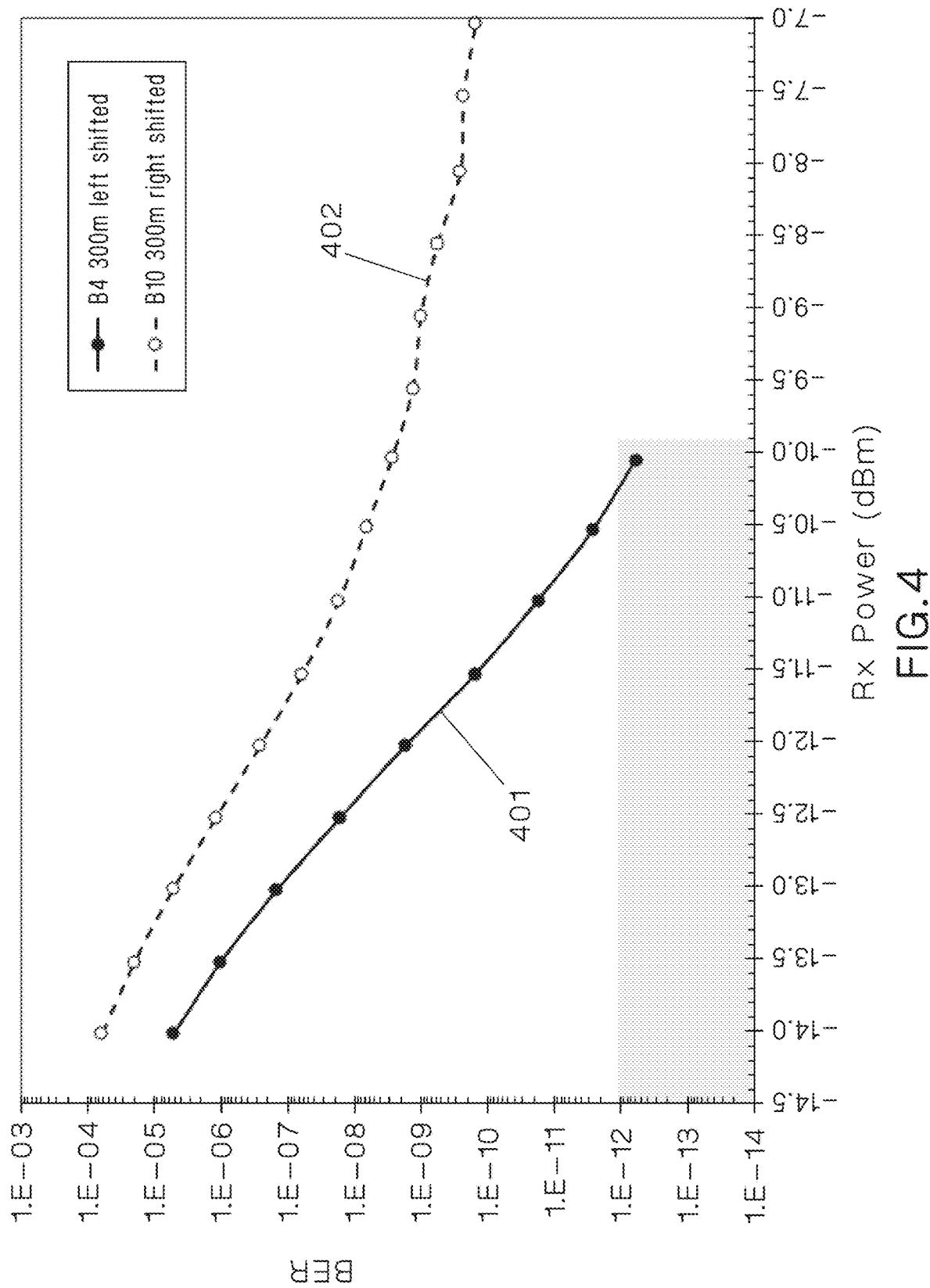
FIG. 4 depicts a plot of the bit error rate (BER) as a function of received optical power (in dBm) for two 300 m OM3 fibers.

FIG. 4 depicts a plot of the bit error rate (BER) as a function of received optical power (in dBm) for two 300 m OM3 fibers 401 and 402, both having identical EMB values of 2450 MHz km and operating at 10 Gb/s. Fiber 401 has a variation in refractive index profile resembling 301, and fiber 402 resembles index profile 302. According to the IEEE 802.3ae Ethernet Standard, the minimum reach requirement for OM3 fiber is 300 m for a received optical power of −9.9 dBm. Test results for these two fibers however, show fiber 401 crosses the 1E-12 BER spec limit at about −10.2 dBm, passing the specified error rate requirement with a 0.3 dB margin, whereas fiber 402 develops a noise floor and exceeds the maximum allowed BER at −9.9 dBm. It has been shown that the root cause of this discrepancy in optical channel system performance is the spatial-spectral coupling of VCSEL modes to fiber modes which results in a large difference in dispersion due to the interaction between the modal and chromatic dispersions. Although fiber 402 passes the minimum EMB standardized specification of 2000 MHz km, due to its refractive index bias 302, the fiber does not support the specified channel reach when coupled to a VCSEL having a $\Delta\lambda_c$. This data illustrates how the standards specified fiber performance metric EMB is not sufficient to predict the maximum channel reach or maximum data rate a fiber-VCSEL communication system can support.

Figure 5:
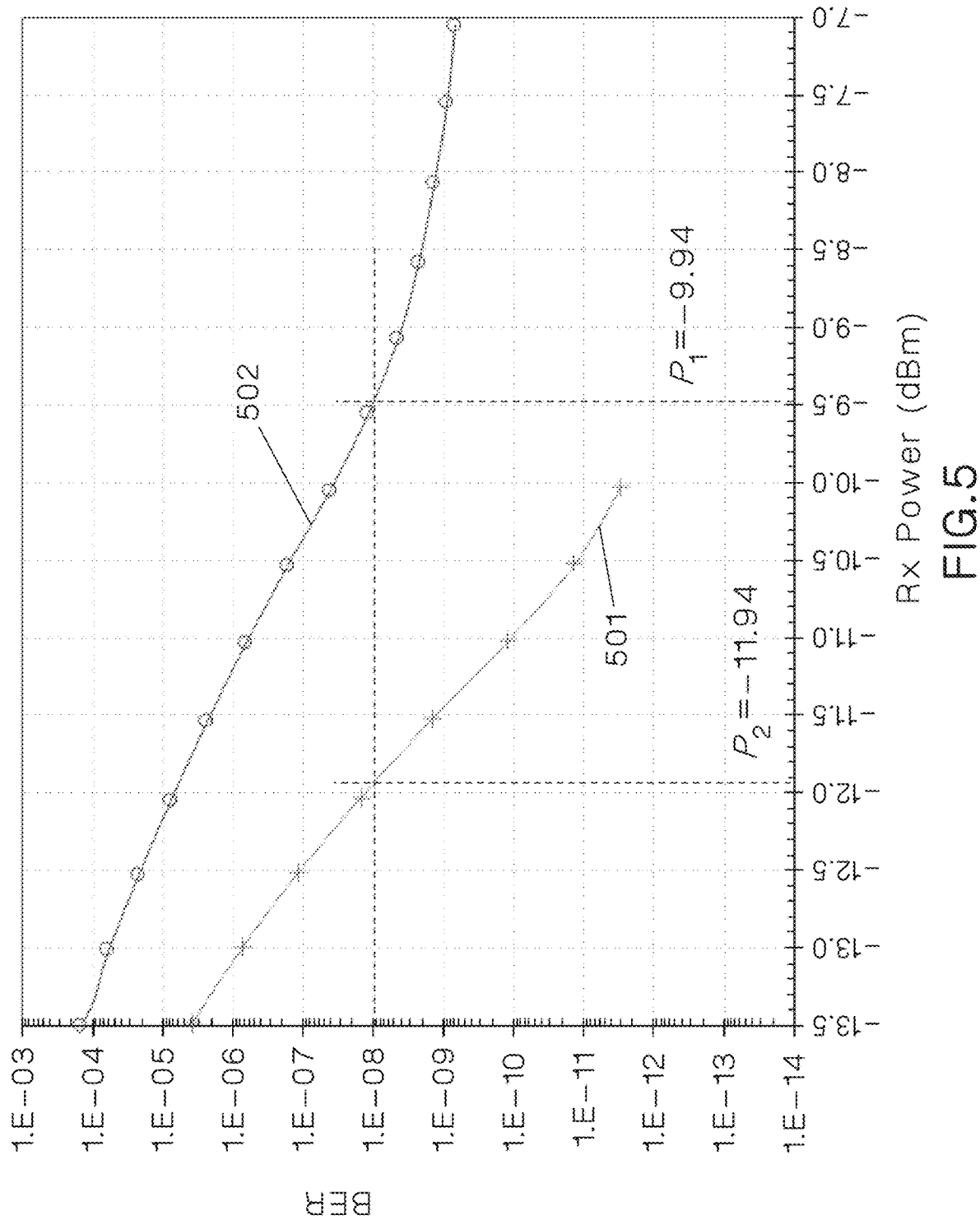
FIG. 5 depicts a plot of the measured BER channel performance for two 550 m OM4 MMF.

FIG. 5 depicts a plot of the measured BER channel performance for two 550 m OM4 MMFs 501 and 502, with measured EMBs of 5060 MHz·km and 5240 MHz km, respectively. Based on the standard EMB metric, fiber 502 should have a lower BER than 501, but we find this is not the case. Due to differences in the bias in refractive index profile, these two fibers show a large difference in channel performance using the same VCSEL transceiver. The data shows that fiber 501 essentially meets the IEEE 802.3ae requirement of a 1E-12 error rate at the minimum received power of −9.9 dBm, whereas fiber 502 on the other hand, exhibits a larger error rate and develops a noise floor never getting below the 1E-12 BER spec requirement. In general, due to the modal-chromatic dispersion interaction, many of the tested fibers develop noise floors which makes it difficult to compare performance at an error rate of 1E-12. However, the BER performance can be compared by using a higher error rate, above which fibers show no significant noise floor. Experiments have indicated that a comparison at an error rate of 1E-8 is a good indicator of relative performance for most, if not all tested fibers.

One metric that can be used to quantify the relative difference in channel performance is received optical power margin, $M_P$, expressed as, $$M_P = \left|\frac{P_1 - P_2}{P_1}\right| = 0.21$$

where, $P_1$ is the received optical power (−11.94 dBm) for the higher performance fiber 501, and $P_2$ is the received optical power (−9.49 dBm) for fiber 502 for a BER of 1E-8. We find the relative power margin for this example is 0.21.

Figure 6:
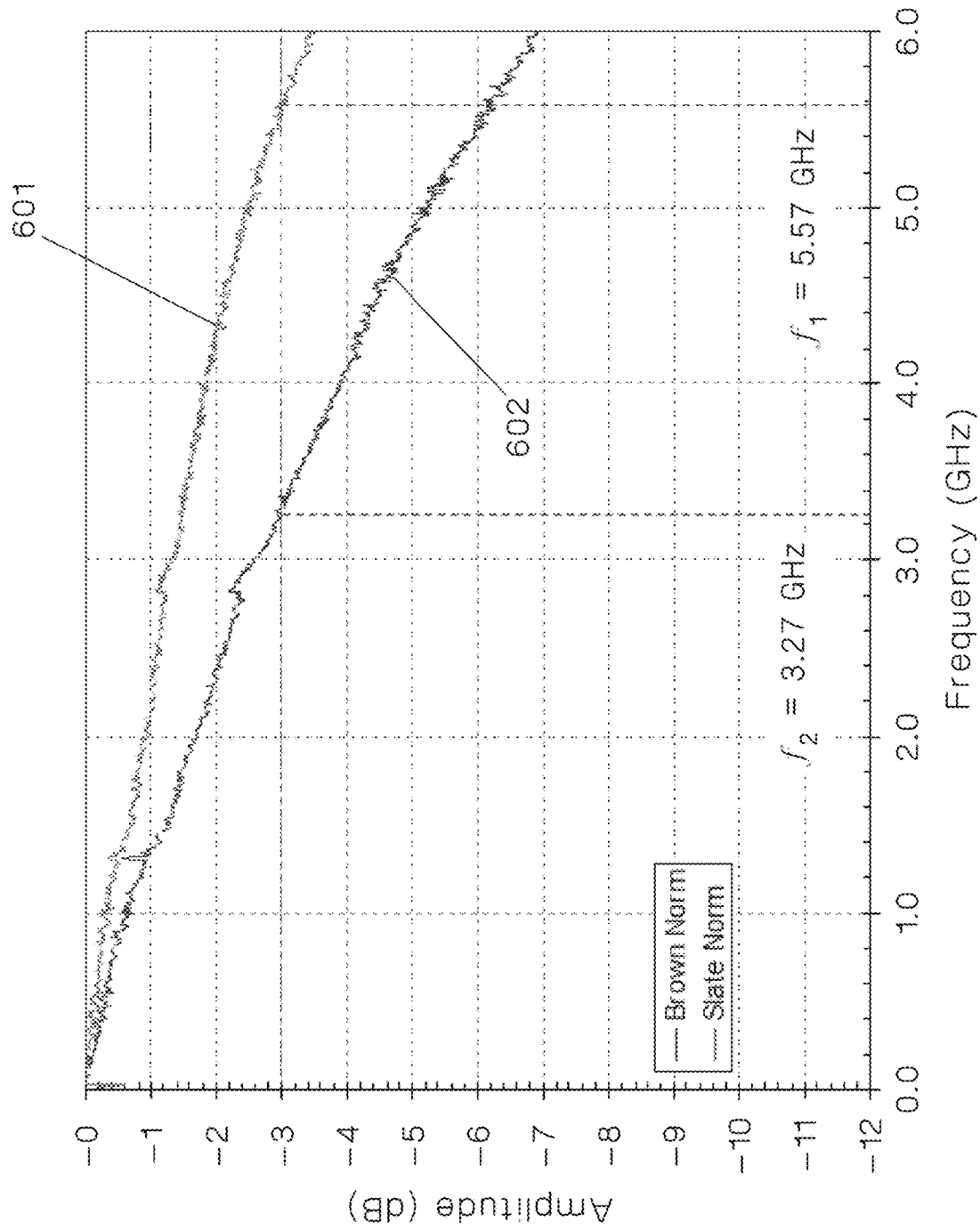
FIG. 6 depicts a plot of the measured frequency response of MMFs 601 and 602 using a network analyzer and a VCSEL transceiver for the same two fibers.

FIG. 6 depicts a plot of the measured frequency response of MMFs 601 and 602 using a network analyzer and a VCSEL transceiver for the same two fibers 501 and 502, respectively. In is important to note that for this measurement a different VCSEL transceiver was used and therefore, a direct comparison to the BER performance cannot be made. However, for exemplary purposes we can demonstrate a correlation between the fiber's BER performance and the relative difference in VCSEL-Fiber 3 dB channel bandwidths use a scaling factor. Referring to the frequency response measurements in FIG. 6, fiber 601 has a 3 dB bandwidth of about 5.56 GHz, whereas fiber 602 has a 3 dB bandwidth of approximately 3.25 GHz. Similarly, we can compare the relative difference, $\Delta_f$, in the 3 dB bandwidths using the expression, $$\Delta_f = \delta\left|\frac{f_1 - f_2}{f_1}\right|$$

where, $f_1$ and $f_2$ are the 3 dB bandwidths of the higher and lower performance fibers 601 and 602 respectively, and $\delta$ is a scaling factor relating the two measurement methods, which also takes into account the VCSEL's spatial and spectral characteristics. Using the measured 3 dB bandwidth values for these two fibers, and letting $\delta=0.5$, we get $$\Delta_f = 0.5\left(\frac{5.57 - 3.27}{5.57}\right) = 0.21$$

hence, we find that for $\delta=0.5$ we get a near perfect correlation between the measured 3 dB bandwidths and the measured VCSEL-fiber BER channel performance for fibers 601 and 602. The objective of this method according to the present invention is to determine the best value for $\delta$. This approach, which is relatively simple in electrical channels, becomes more complex in a VCSEL-MMF channel due to the reasons mentioned above. There are several parameters that can be used to select a reference VCSEL such as rise-time, relative intensity noise, bandwidth, and spatial spectral bias. Those parameters can be verified and selected using specific test patterns and an oscilloscope in order to estimate $\delta$. However, a critical parameter to guarantee the accuracy of the bandwidth estimation is controlling the launch condition. The apparatus and method to provide an accurate measurement of the fiber bandwidth are detailed in the description of the invention.

Figure 7:
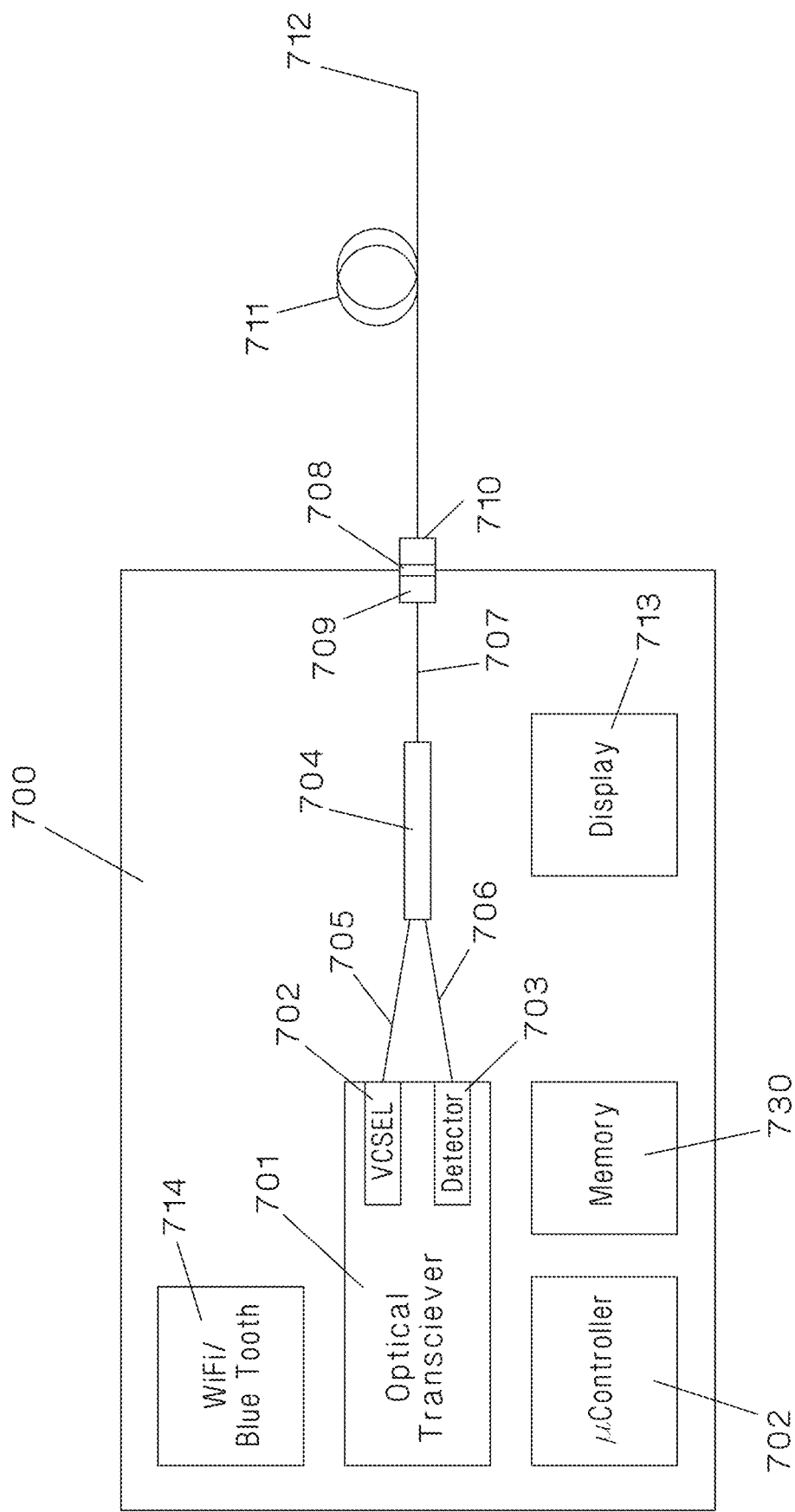
FIG. 7 depicts basic components of an exemplary apparatus 700 according to the present invention.

FIG. 7 depicts basic components of an exemplary apparatus 700 according to the present invention. The apparatus is a handheld device for field use, which includes an optical transceiver 701, a microcontroller or processor 702, onboard memory 703, an optical splitter 704, an optical adapter 708 for connecting a fiber carrying an optical test signal to the channel under test 711, and firmware capable of generating a test signal, receiving the test signal, processing the send and receive signals, and estimating the channel reach and bandwidth of a fiber under test.

Figure 8A:
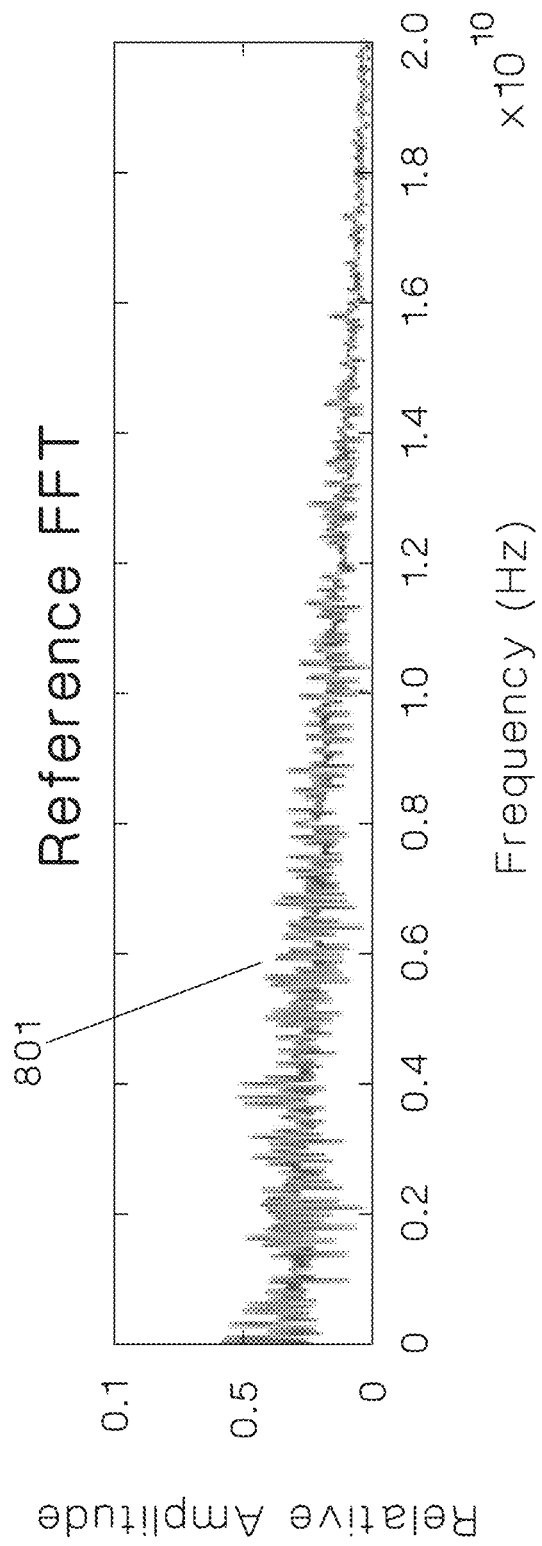
FIGS. 8a-8c depict one method according to the present invention for calculating the bandwidth of an optical fiber channel.
Figure 8B:
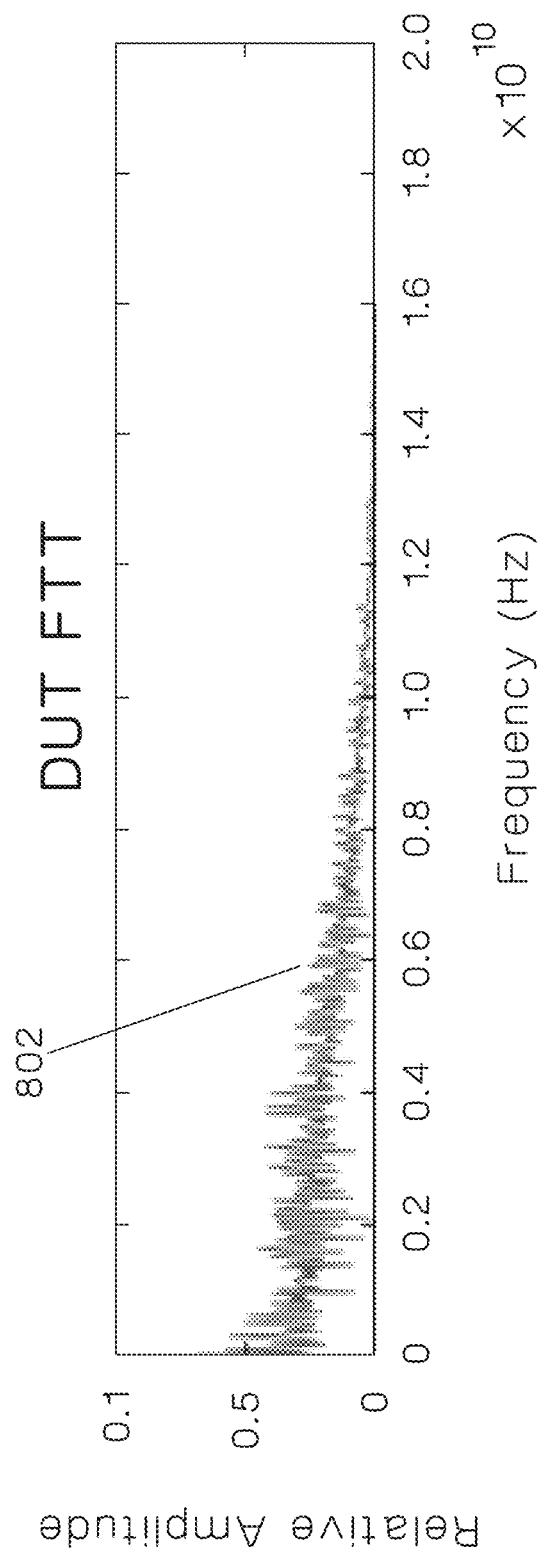
Figure 8C:
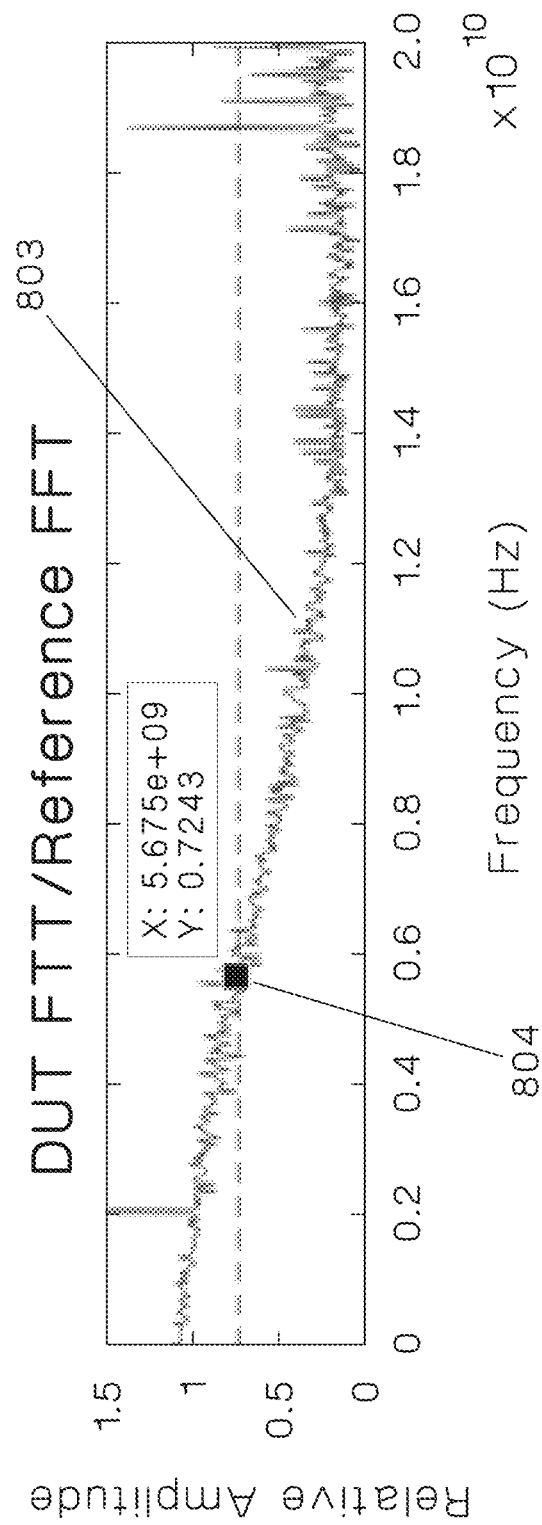

FIGS. 8a-8c depict one method according to the present invention for calculating the bandwidth of an optical fiber channel. An electrical data signal is sent from a microcontroller 702 to drive VCSEL 702, which converts the electrical signal to an optical signal. The optical signal is coupled into a launch fiber 707 and is redirected back into detector 703 as a reference signal, which is then converted to the frequency domain 801 using the fast fourier transform (FFT). Once a reference signal is produced, a fiber under test is connected to the launch fiber 707 via input 710 of optical adapter 708, where optical detector 703 receives reflected optical signal after round trip propagation through the FUT, where it is converted back to an electrical signal for analysis. The returned test signal is likewise converted to the frequency domain 802 using an FFT. The test signal FFT 802 is then divided point by point by the reference signal FFT 801 to acquire the frequency response of the test signal 803. The 1.5 dB cutoff 804 of the fiber under test frequency response 803 is then used to calculate the channel bandwidth.

Figure 9A:
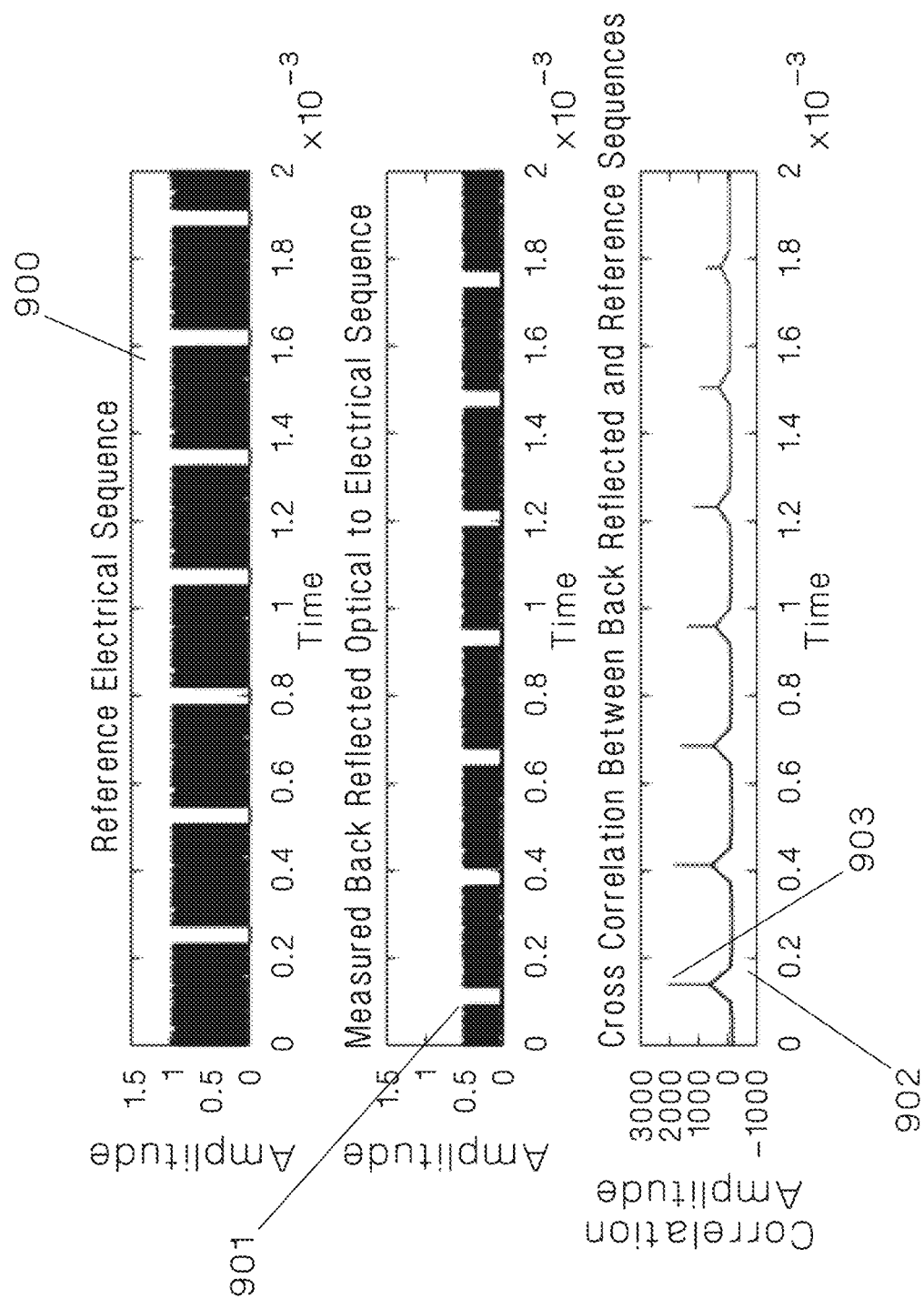
FIGS. 9a-9b depict one method according to the present invention, where the same pattern used to calculate channel bandwidth is also used to calculate channel length.
Figure 9B:
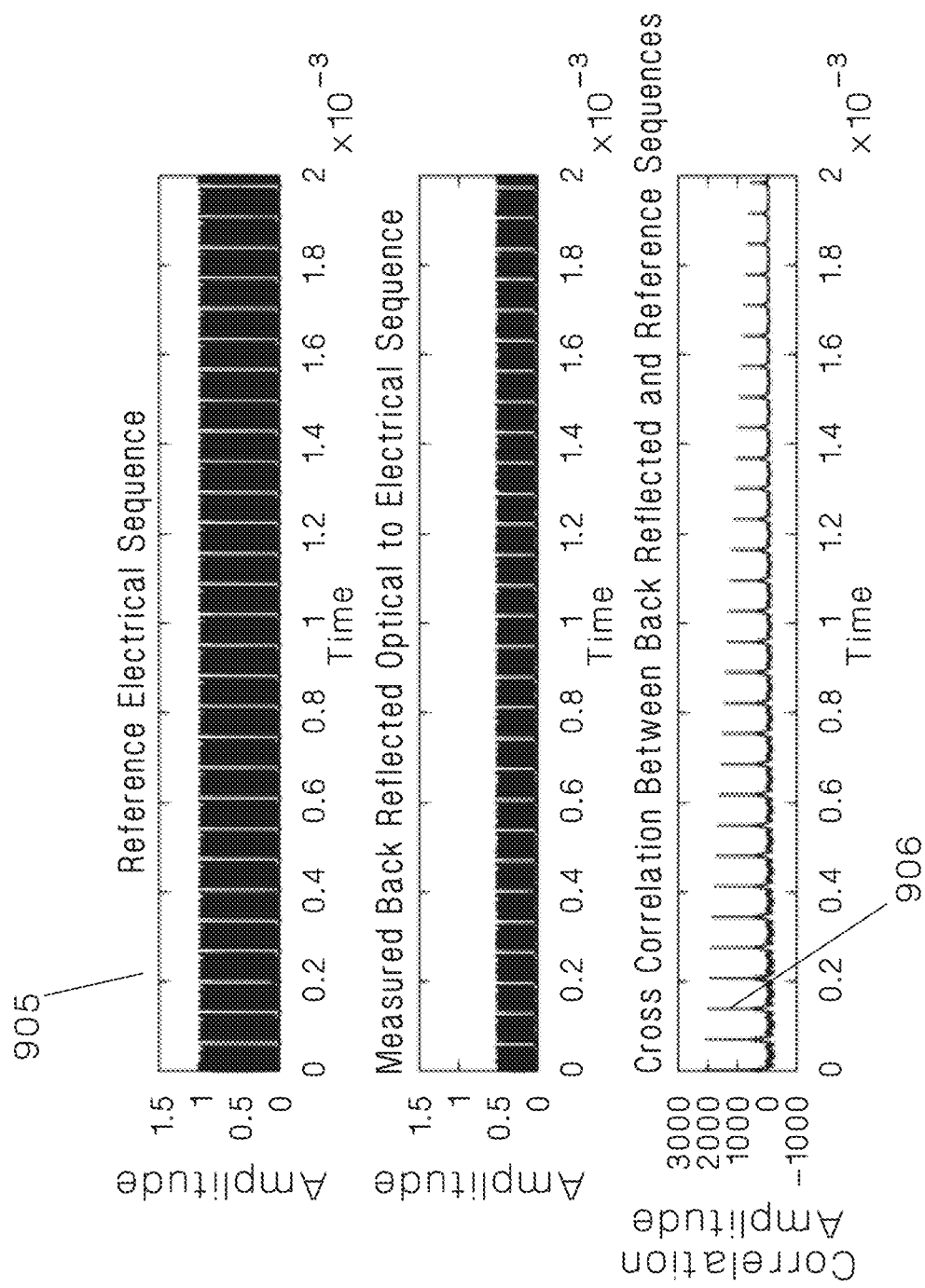

FIGS. 9a-9b depict one method according to the present invention, where the same pattern used to calculate channel bandwidth is also used to calculate channel length. The data in this figure shows the electrical sequence 900 which drives the VCSEL. The optical back reflection from the end of the fiber channel 901 is measured and then cross correlated with the electrical sequence 902. The cross correlation consists of peaks 903 occurring at the multiples of the time of flight of the signal from source to detector, which can be converted to length by the simple equation, $$L_{FUT} = \frac{t}{2}\frac{c}{n}$$

where, $L_{FUT}$ is the length of the optical fiber channel under test, t is the test signal round trip time of flight, and c is the speed of light in vacuum, and n is the core refractive index. Using the same sequence at higher sample generating rates 905, $L_{FUT}$ will result in higher resolution measurements, but many more peaks 906. Optimal length measurements can be taken using one slow sample generation rate for ballpark length estimation, and then a following faster sample generation rate to find a high precision value for channel length. With this method it is possible to accurately measure channel length to below 10 mm precision.

An apparatus according to the present invention is a handheld device that utilizes the methods outlined in the description of figures for measuring and estimating (or verifying) the maximum data rate an optical fiber channel can support. The apparatus is particularly useful to Enterprise data communication networks operators, where networks often contain legacy backbone fiber cabling of unknown data rate capacity. An apparatus according to the present invention can quantify the maximum bandwidth capacity of an installed legacy fiber and determine if the cable has the bandwidth to supporting a higher communication data rate for network upgrades. Such an apparatus can potentially eliminate the need for replacing the installed cabling infrastructure. The invention is also useful for data center operators to verify channel performance where channel reaches might be close to exceeding industry standards.

The performance measurement that quantifies the maximum transmission data rate and reach of an optical channel, is the BER. Industry standards for data rates of 10 Gb/s and higher require error rates to be less than 1 error bit in every 1 trillion bits transmitted (1E-12). Due to the spatial-spectral coupling of VCSEL modes into fiber modes, the BER of an optical channel cannot be predicted based on the fiber's measured EMB alone but must take into account the total bandwidth of the VCSEL-Fiber optical system. To evaluate the spatial-spectral bandwidth of a VCSEL-Fiber communication channel, VCSEL 702 in transceiver 701 must be characterized in terms of its bandwidth and spectral-spatial launch conditions, which requires a careful evaluation of the light distribution inside fiber 707, being launched to the fiber under test 711. The optical spatial-spectral distribution within a reference multimode fiber will be utilized to produce a reference data in the subsequent channel analysis. One proposed method for producing the desired light distribution in launch fiber 707, is to incorporate an optical fiber designed for slightly higher core diameter and tailored by including bends in the fiber to adjust the light distribution in the core to match worst case VCSEL launch conditions. The worst-case launch conditions can be measured and verified using a fiber dispersion reference modules designed to stress transceivers as disclosed in another application (patent application for FDRM).

The optical channel under test can comprise of any number of fiber links connected together in series to form a channel. The apparatus in accordance with the present invention predicts the maximum data rate that can be supported by the channel. A more complete understanding of the invention may be obtained following a description of a specific embodiment of the invention. FIGS. 8a-8c illustrates the basic elements of an exemplary embodiment of the invention. Microcontroller 702, generates and sends an electrical test signal such as a pulse, pulse sequence, chirped pulses, or any combination of pulses to optical transmitter 701, where the electrical signal is converted to an optical signal and launched out of VCSEL 702 into optical fiber 705, which is one leg of an optical splitter device 704. The optical test signal exits splitter 804 and travels through launch fiber 707, which terminates in an optical connector seated in optical adapter 708. An optical fiber under test 711 is connected to said apparatus by means of adapter 708 via an optical connector at port 710. In this embodiment, the test optical signal is back reflected from the remote end of the channel under test, by the glass-air fiber endface, or other means such as a reflector, circulator, or 1 by 2 splitter where the output fibers of the splitter are connected for loop back.

The returned test signal is received by photodetector 703 via leg 706 of splitter 704. Microcontroller 702 analyzes the returned channel test signal 802 and compares it to the reference signals 801 performing two calculations; a bandwidth computation using the Fast Fourier Transform (FFT) and a length computation, where the reference FFT includes the effect of modal-chromatic dispersion. The bandwidth can be computed by dividing the test channel FFT and reference signal FFT in the frequency domain 903 and picking a loss threshold. The bandwidth of the channel under test 904 in Hz is frequency corresponding to the selected loss threshold, in this example, 1.5 dB. The channel optical length can be computed by cross-correlating the reference and channel under test measured signals to determine the relative time delay between them. Combining these bandwidth and channel optical length measurement, a bandwidth distance product may be obtained from a single measurement, accurately characterizing the maximum signaling speed the channel is capable of supporting.

Once the total VCSEL-Fiber bandwidth and channel length of the fiber under test are determined, the maximum data rate supported by the channel can be estimated and displayed by means of a local display 713 and/or communicated to a smart device via a Bluetooth or WiFi interface 714.

Although the specific exemplary embodiment shown in this invention describes an apparatus connected to one end of the channel under test, it is understood that various embodiments including connecting devices to both ends of the channel under test, may be made without departing from the spirit of this invention. For example, in a second embodiment the transmitter can be replaced at the remote end 712 of the fiber under test with a pre-set signal sequence. In this embodiment it is possible to eliminate splitter 704 and transceiver output port 702.

The invention claimed is:
1. A method of testing optical channel bandwidth comprising:
providing at least one optical source, a high-speed photodetector, a microcontroller or processor, and electri- cal circuitry to power and drive the optical source, high-speed photodetector, and microcontroller or processor;

measuring a frequency response and optical path length of a multimode optical fiber under test, utilizing a reference laser with specified spectrum interaction data to estimate total modal-chromatic bandwidth of the fiber under test; and computing and presenting the estimated maximum data rate the fiber under test can support.

2. The method of claim 1, further comprising verifying that a specified data rate can be supported over the fiber channel under test.

3. The method of claim 1, further comprising displaying test results to a user.

4. The method of claim 1, further comprising providing a patch cord attached between the source and fiber under test, wherein the patch cord is designed to provide a worst-case launch condition for a given Ethernet or Fiber Channel application.

5. The method of claim 1, further comprising providing a switch and a set of patch cords attached between the source and fiber under test, and automatically switching among the patch cords to create diverse launch conditions to address worst case sources for a given Ethernet or Fiber Channel application.

6. The method of claim 1, wherein the at least one optical source is a VCSEL selected to excite the relevant mode groups of the fiber optical channel under test.

7. The method of claim 6, wherein a bias current of the VCSEL is controlled to provide worst-case spectral width and launch condition to provide worst case conditions testing.

* * * * *